US007012419B2

(12) United States Patent
Deibele

(10) Patent No.: US 7,012,419 B2
(45) Date of Patent: Mar. 14, 2006

(54) FAST FARADAY CUP WITH HIGH BANDWIDTH

(75) Inventor: Craig E. Deibele, Knoxville, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 0 days.

(21) Appl. No.: 10/810,088

(22) Filed: Mar. 26, 2004

(65) Prior Publication Data
US 2005/0212503 A1 Sep. 29, 2005

(51) Int. Cl.
G01N 27/00 (2006.01)
(52) U.S. Cl. ...................... 324/71.3; 250/397
(58) Field of Classification Search ............ 324/71.1, 324/71.3, 751–754, 71.4
See application file for complete search history.

(56) References Cited

U.S. PATENT DOCUMENTS

| 4,633,172 A | * | 12/1986 | Ekdahl et al. | ............... 324/126 |
| 4,703,256 A | * | 10/1987 | Hayafuji | .................... 324/71.3 |
| 5,103,161 A | * | 4/1992 | Bogaty | ...................... 324/71.3 |
| 5,583,427 A | * | 12/1996 | Teruya et al. | ............... 324/71.3 |
| 6,300,642 B1 | * | 10/2001 | Cho et al. | ............... 250/492.21 |
| 6,300,755 B1 | * | 10/2001 | Elmer et al. | ................ 324/71.3 |
| 6,749,928 B1 | * | 6/2004 | Takaya et al. | ............... 428/209 |
| 6,768,324 B1 | * | 7/2004 | Yamada et al. | ............. 324/751 |
| 6,815,960 B1 | * | 11/2004 | Ishii | .......................... 324/751 |

OTHER PUBLICATIONS

F. Marcellini et al, "Design of a Tapered Stripline Fast Faraday Cup for Measurements on Heavy Ion Beams: Problems and Solutions", Beam Instrumentation Workshop, 1998. (www.slac.stanford.edu/pubs/confproc/biw98/poggi-marcellini.pdf).
C. Deibele, "Proposal for the Design of the Fast Faraday Cup to Measure the Longitudinal Profile of the 2.5 MeV Beam After the RFQ at the SNS," 2001. (http://it.sns.ornl.gov/asd/public/pdf/sns0004/sns0004.pdf).
M. Ferianis et al, "Characterization of Fast Faraday Cups at the Elettra Linac", Proceedings DIPAC 2003—GSI, Mainz, Germany, Jul. 2003. (http://bel.gsi.de/dipac2003/html/auth0175.html).

* cited by examiner

Primary Examiner—Diane I. Lee
Assistant Examiner—Marina Kramskaya
(74) Attorney, Agent, or Firm—James M. Spicer

(57) ABSTRACT

A circuit card stripline Fast Faraday cup quantitatively measures the picosecond time structure of a charged particle beam. The stripline configuration maintains signal integrity, and stitching of the stripline increases the bandwidth. A calibration procedure ensures the measurement of the absolute charge and time structure of the charged particle beam.

7 Claims, 6 Drawing Sheets

Front View

Side View
(Cross-Section)

Front View

Side View
(Cross-Section)

Front View

Side View
(Cross-Section)

FAST FARADAY CUP WITH HIGH BANDWIDTH

STATEMENT REGARDING FEDERALLY SPONSORED RESEARCH OR DEVELOPMENT

The United States Government has rights in this invention pursuant to contract no. DE-AC05-00OR22725 between the United States Department of Energy and UT-Battelle, LLC.

FIELD OF THE INVENTION

The present invention relates to devices for measuring the longitudinal microstructure of a charged particle beam to a very high bandwidth, and more particularly relates to a Fast Faraday cup system based on a circuit card stripline design.

BACKGROUND OF THE INVENTION

Previous measurements of Fast Faraday cup devices used to measure the longitudinal microstructure of charged particle beams in a vacuum environment have shown a bandwidth limitation on the order of 6 GHz. Fast Faraday cups have been shown to have other limitations as well. They allow crosstalk and contamination of signals when used in a noisy accelerator environment. The improper choice of connectors can result in strict bandwidth limitations. The cup designs have also had fabrication problems. For example, when much of the electromagnetic shield fabrication and assembly for the low energy beams was done by hand, the bandwidth has been limited. Also, the use of surface mount resistors to electrodynamically match to the cup is particularly harmful when measuring weak signals because the resistors have bandwidth limitations in addition to introducing loss.

My invention provides a Fast Faraday cup for measuring the longitudinal microstructure of a charged particle beam to a very high bandwidth. It is designed in a stripline circuit board configuration that comprises a bottom ground layer; a dielectric layer; a trace, a portion of which is used as the beam target or cup; another dielectric layer; and a top ground. The device can be fabricated using one or two connectors for retrieving the signal. Further and other aspects of my invention will become apparent from the description contained herein.

It is a first object of the invention to electrodynamically match the beam target (which is a physical part of the trace) to ground by matching the impedance of the beam target to the impedance of the trace.

It is another object of the invention to utilize stripline technology rather than microstrip technology in order to improve the bandwidth, dispersion and noise immunity of the system.

It is a further object of the invention to utilize connectors, amplifiers and cabling that, along with appropriate signal processing preserves the fill bandwidth of the system.

It is another object of the invention to match the size of the beam target (fast cup) to the size of the beam.

A still further object of the invention is to electrodynamically match the connectors, amplifiers, cables, etc., used with the device to maximize signal integrity.

Yet another object of the invention is to calibrate the cabling, amplifier, and vacuum interconnections of the system to measure the true response of the signal.

SUMMARY OF THE INVENTION

The invention is a circuit card stripline Fast Faraday cup system for measuring the structure of a charged particle beam that includes a first groundplane; a first dielectric bonded to the first groundplane; a conductor bonded to the first dielectric wherein a portion of the conductor is used as the beam target; a second dielectric bonded to the conductor by means of a bonding dielectric, the bonding dielectric having the same dielectric constant as the first dielectric; a second groundplane (initial groundplane) bonded to the second dielectric, the second dielectric and the second groundplane having a channel for the unimpeded passage of the beam to the beam target; a high bandwidth digitizer connected to the conductor, the high bandwidth digitizer electrodynamically matched to the conductor and the beam target; and electroplated stitching of the first groundplane to the second groundplane to prevent the occurrence of a resonance condition between the first and second groundplanes.

DETAILED DESCRIPTION OF THE INVENTION

Figure 1:
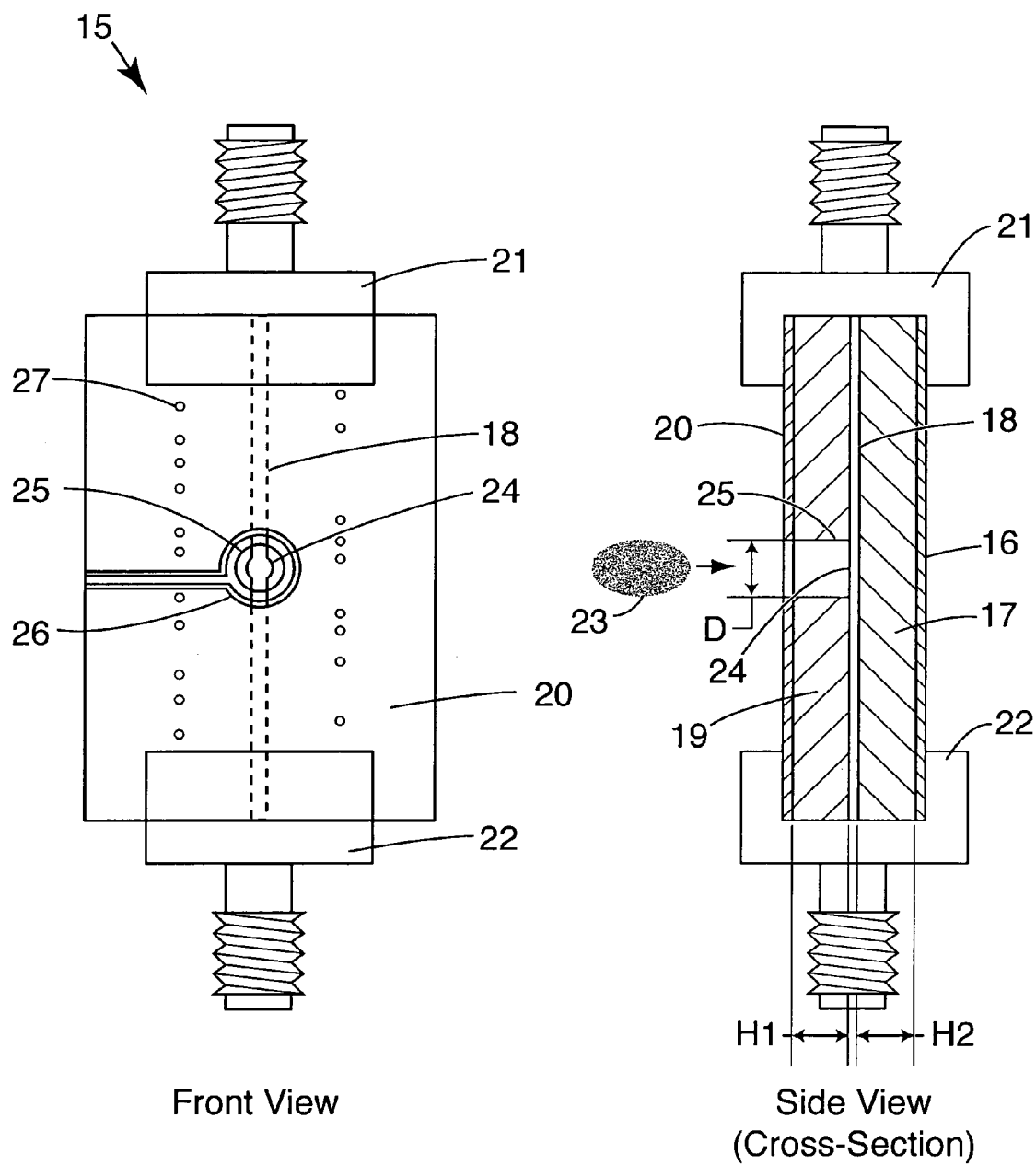
FIG. 1 illustrates a front view and a side cross-sectional view of a preferred two-connector embodiment of the invention.

FIG. 1 illustrates front and cross-section views of a preferred two-connector embodiment of the invention. In FIG. 1, the Fast Faraday cup 15 is designed in a four-layer stripline circuit card configuration that comprises a bottom ground layer (first groundplane) 16, a dielectric layer 17, a trace 18, a portion of which (24) is the actual cup or beam target, another dielectric layer 19, and a top ground layer (initial groundplane) 20. The two grounds 16, 20 surround the circuit card. These grounds shield the target 24 and trace 18 from the harsh electrodynamic environment, and also reduce the noise of the charged particle beam 23 while guiding the induced signal on the trace. The device is fabricated with two edge launch connectors 21, 22 that are broadband matched to the circuit card and are used for retrieving the signal. If it is desired to use only one of the connectors, the unused end of the trace 18 can be terminated in the transmission line impedance of, for example, 50 ohms. In FIG. 1, the dimension D is the diameter of the hole for the beam to strike the target 24. The dimension H1 is chosen for the energy and/or speed of the charged particle beam 23. The dimension H2 and the choice of dielectric constant are chosen to have a convenient sized-thickness circuit board that fits standard high frequency connectors.

The beam target 24 is electrodynamically matched to the trace 18, cables (not shown), and connectors 21, 22 of the fast cup system. The beam (or bunch) of charged particles 23 is made to impinge on the beam target portion 24 of the trace 18 after passing through a channel 25 in the top ground layer 20 and dielectric layer 19. The trace 18 is matched electromagnetically to the circuit card stripline and the channel 25 in the top ground layer 20 and dielectric layer 19 such that with the removal of the circuit card and connectors, the reflection coefficient of the channel is better than −30 dB.

The circuit card uses edge launch connectors 21, 22 such as SMA connectors which can be reliably used to 26 GHz. 2.4 mm connectors can also be used reliably to 50 GHz. If only one connector 21 is used, the signal is greater by a factor of two over the two conductor embodiment since the current from the beam does not split and dissipate energy in the load resistor. The connector is matched electrodynamically to the trace such that reflections from the connector/trace interface are minimal.

Figure 3:
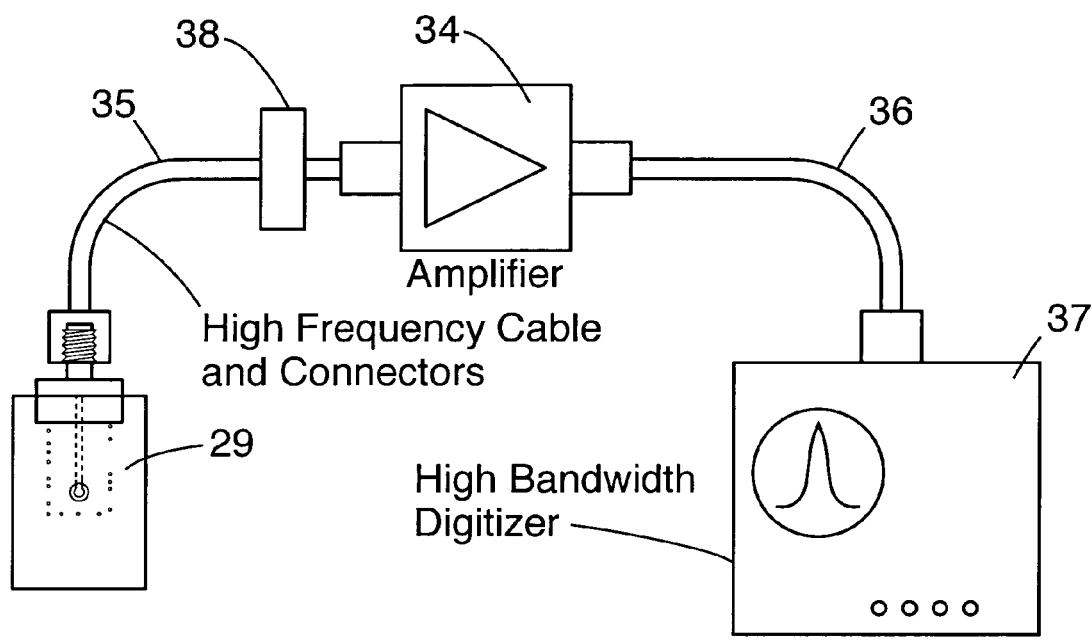
FIG. 3 illustrates the single connector embodiment of FIG. 2 connected to an amplifier and a sampling oscilloscope.

In FIG. 3, a vacuum interconnect 38, amplifier 34, high frequency cables 35, 36, and sampling oscilloscope 37 complete the Fast Faraday cup system. Amplifier 34 may be necessary near the cup so that the losses of the cables do not attenuate the high frequency components of the induced beam signal. The amplifier and cables can be measured and the transmission characteristics of the setup can then be de-embedded, thereby resulting in a true metric of the longitudinal profile of the charged particle beam.

In FIG. 1, an optional bias conducting ring 26 may be added to the top ground layer 20. Alternatively, an additional layer in a 6 layer circuit board may be implemented for a bias ring. This ring is used if electrons scatter from the target 24 of the circuit card. As charged particles strike the conductive target 24, they may excite secondary electrons from the conductor 24 surface. By utilizing the bias ring 26 over the target, any electrons that may become released from the target 24 are repelled back to the target, as though they never left it, maintaining signal integrity.

An important aspect of the invention is that the top and bottom layers 16, 20 of the stripline are stitched together electrically (illustrated at 27) so that only the stripline transmission line mode of operation is possible. The top ground 20 is necessary to shield the small target channel 25 so that precursor fields of a slow beam do not intercept the target 24. The system is connected with precision connectors 21, 22 that are capable of transmitting up to 50 GHz. The effect of the cables, interconnects, vacuum components, and amplifiers can then be measured and de-embedded from the measurement and a clean spectrum as well as clean time domain results produced. The thickness of the circuit card is important to limit the effect of the precursor fields, especially for beams of particles of low velocity.

Figure 2:
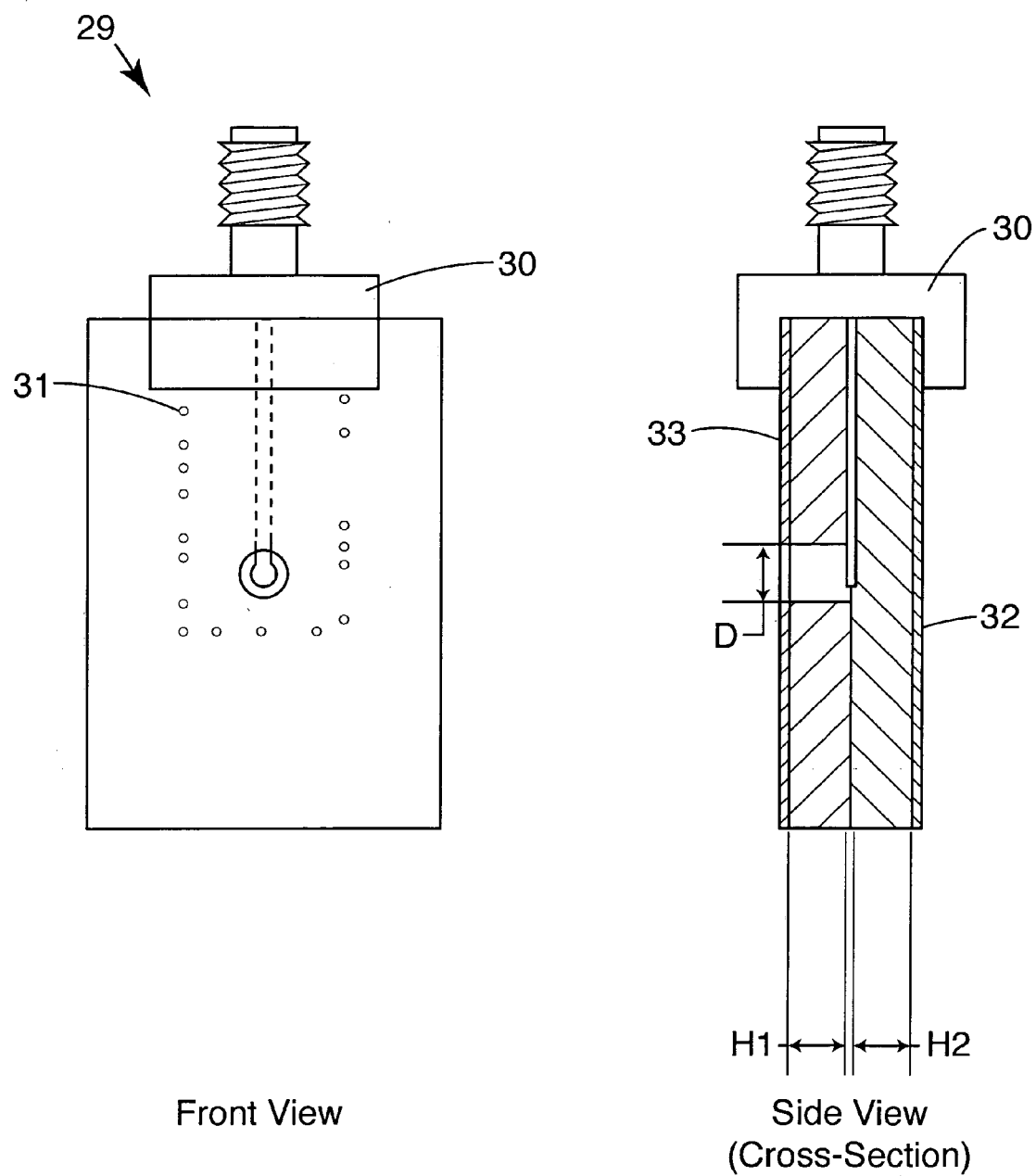
FIG. 2 illustrates a front view and a side cross-sectional view of a preferred one-connector embodiment of the invention.

FIG. 2 illustrates front and cross-section views of a one-connector embodiment 29 of the invention. It is similar to FIG. 1 except that it employs only one edge launch connector 30. In particular, FIG. 2 illustrates the placement of the electrical stitching 31 on the circuit card when only one edge launch connector is employed. The single connector provides better performance than the dual connector for the reason that twice the signal is obtained from it. The size of the signal peak is two times larger, and therefore the signal-to-noise ratio is better by 3 dB.

The stitching, illustrated at 27 in FIG. 1 and at 31 in FIG. 2, is used to prevent a resonance condition from developing between the top and bottom groundplanes 16, 20 and 32, 33, respectively. Stitching ties the top and bottom groundplanes together. It is produced, depending on the fabrication process of the circuit board, by drilling through the entire circuit card after it is put together, and then electroplating the holes that have been drilled with copper such that the top and bottom groundplanes are connected electrically. The copper-filled holes are located a distance away from the trace that is a function of the stripline height. In a stripline, the fields decay exponentially away from the edge of the trace, which is proportional to the height of the stripline. Typically, the copper-filled holes are placed on the order of three board heights away from the edge of the trace at a minimum. If placed any closer, the effect of the stitching would become a dominant effect in the characteristic impedance of the stripline.

The holes 27, 31 are drilled with random spacing. If spaced in a deterministic manner, e.g., every 250 thousands of an inch, then small resonances could occur on the trace, which would affect the broadband performance of the stripline itself. If the holes are spaced randomly, the resonance effect is minimized.

The hole spacing is a function of the beam being measured. The spacing must not be over a quarter wavelength of the highest frequency of interest. For example, for a desired 50 GHz bandwidth, one would look at the dielectric that the circuit card is manufactured on. Knowing that it was Teflon with a dielectric constant of 2.1, for example, one could calculate the wavelength. One would then place the holes for the stitching at least a quarter wavelength apart, or shorter. One would place them randomly along the length, e.g. a quarter wavelength plus a little, quarter wavelength minus a little. On each side, the holes are not placed at the same longitudinal position, but in a staggered or random manner. Any spacing that is too repetitive will permit an unwanted resonance to occur. The holes may be placed in a straight line along the trace, but the absolute position longitudinally is staggered.

The stitching is used because a stripline with a center trace can support two modes of operation fundamentally. The unwanted mode is a parallel plate waveguide mode. The stitching forces the two ground planes to have the same potential. With stitching, the parallel plate waveguide mode cannot exist, and an unwanted resonance is prevented from occurring. Thus, the stitching greatly aids the overall broadband performance of the system. If, for example, the upper bandwidth without stitching is 10 GHz, with stitching the upper bandwidth may be 100 GHz.

Figure 4:
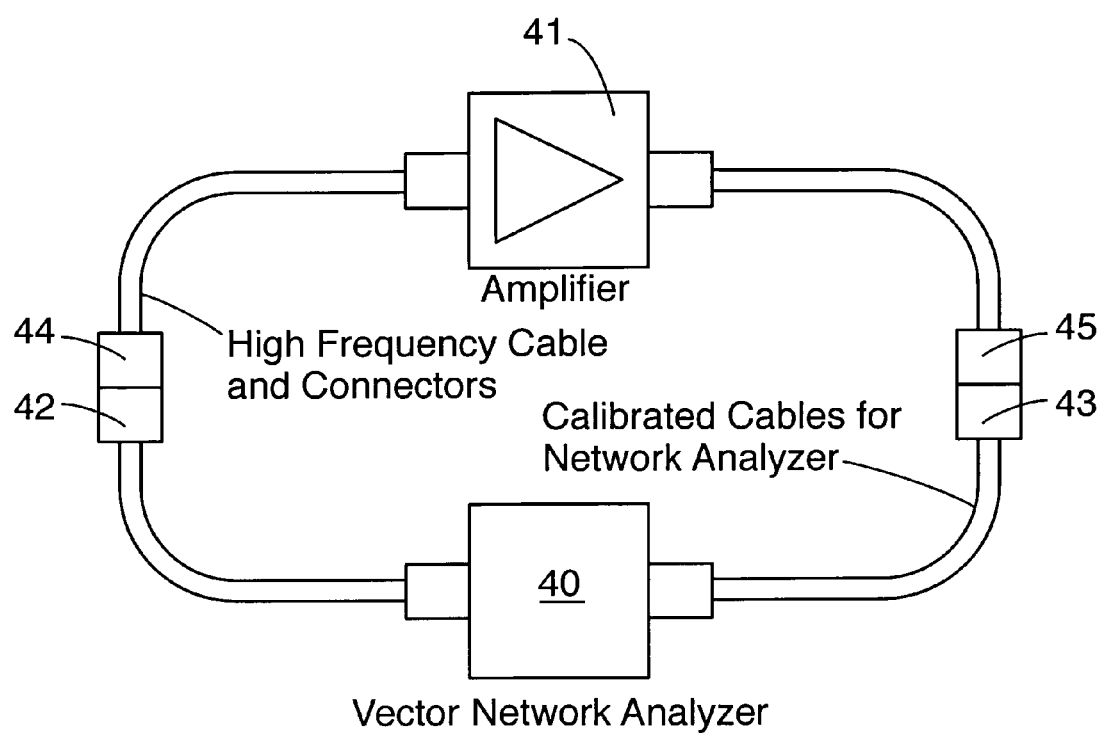
FIG. 4 illustrates the manner of calibrating the system instrumentation comprising the vector network analyzer, connectors, and amplifier.

FIG. 4 illustrates the calibration of the system instrumentation using a vector network analyzer 40, connectors, and amplifier 41. With the connectors 42, 43 connected together, the network analyzer 40 is calibrated using a standard method of calibration. Then the connector 44 and connector 45 are connected as shown in FIG. 4 for the measurement of the transmission through that assembly. The amplifier 41 will have gain, and the cabling will have losses, and they both suffer time delay and dispersion, which is eliminated in the calibration procedure.

In FIGS. 3 and 4, the vector network analyzer 40 processes a time-delayed, amplified charged-particle-beam-induced signal from the Fast Faraday cup. The calibration steps include measuring the frequency response of the cabling 35, 36, vacuum interconnect 38, and amplifier 34 between the Fast Faraday cup 29 and the high bandwidth digitizer 37. Next, the digitized signal from the high bandwidth digitizer 37 is Fourier transformed. Then, the frequency response, Fourier transformed digitized signal, and a window function are multiplied together. Finally, the multiplied frequency response, Fourier transformed digitized signal and window function result is inverse Fourier transformed to obtain the calibrated time domain charge distribution in the Faraday cup. The calibration thus deconvolves the time delay and dispersion effects, so that the true impulse response is obtained.

RESULTS

Figure 5:
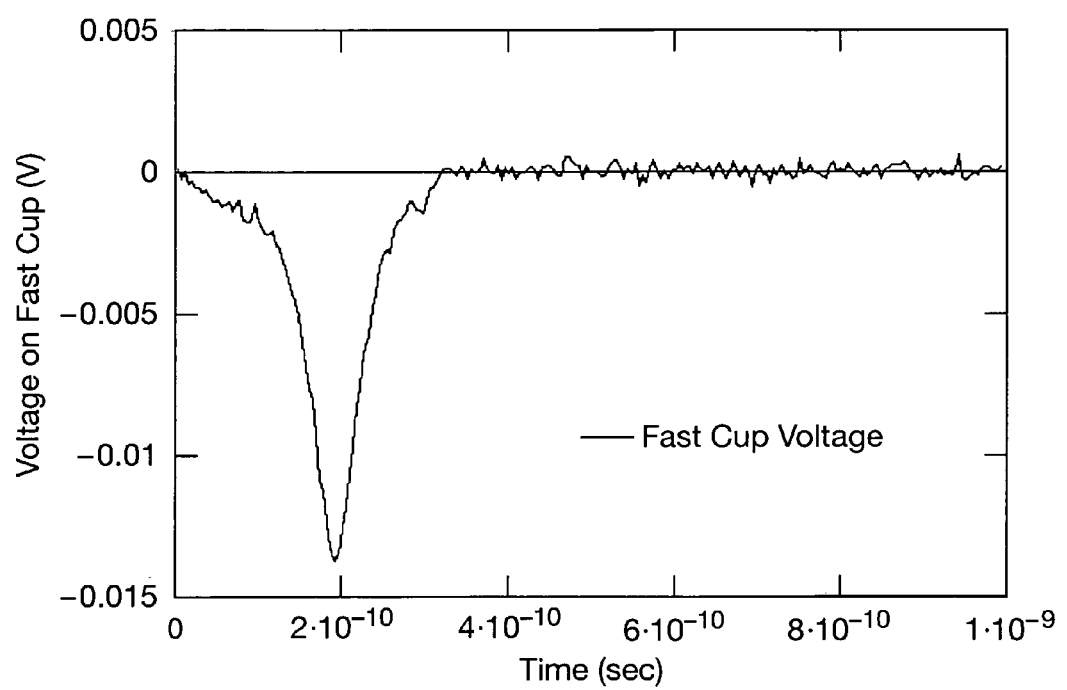
FIG. 5 is a plot of the calibrated response of the fast cup to a charged article beam. It is a plot of the longitudinal profile of a charged particle beam versus time.

FIG. 5 is a plot of the response of the Fast Faraday cup to a charged particle beam. The negative going peak in FIG. 5 is the longitudinal profile of a charged particle beam plotted versus time. This measurement of a charged particle beam at the Spallation Neutron Source (SNS) facility shows a beam width of about 130 psec FWHM. The plot clearly sh6ws that there is no ringing immediately after the pulse. The size of the signal is ~12 mvolts, a very weak signal due to the position of the cup in the SNS linac, and the lack of transverse focusing of the quadrupole magnets in the linac.

Figure 6:
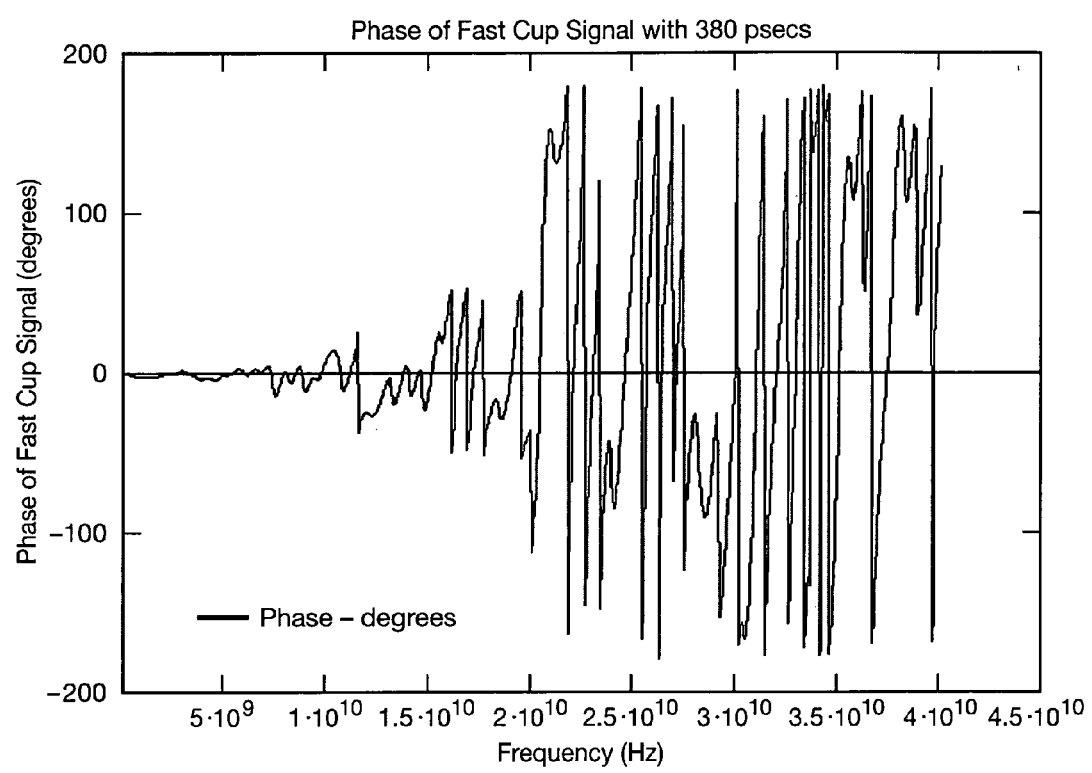
FIG. 6 is a plot of the bandwidth of the system obtained by examining the phase of the calibrated fast Fourier transform of the signal shown in FIG. 5.

FIG. 6 is a plot of the bandwidth of the system obtained by doing a fast Fourier transform of the signal shown in FIG. 5. FIG. 6 shows the phase of the signal. The signal has good bandwidth out to about 20 GHz. There are some resonance spikes, but these are due to the bunch shape. Behavior after 20 GHz is truly noise because the phase is going between +180 degrees and −180 degrees. Again, this limitation is easily overcome with proper placement of the cup in the linac for better transverse focusing and longitudinal beam blowup.

The Fast Faraday structure described herein will measure beams to a bandwidth of 40 GHz, a bandwidth that is over six times greater than previously measured. Such a bandwidth improvement allows the experimenter to measure a beam to a resolution of 10 picoseconds. The stripline design has a bandwidth easily above the bandwidth of the Spallation Neutron Source (SNS), the charged particle accelerator for which it has been developed.

REFERENCES

J. M. Bogaty et al, "Stripline Fast Faraday Cup for Measuring GHz Structure of Ion Beams," U.S. Pat. No. 5,103,161, issued Apr. 7, 1992.

F. Marcellini et al, "Design of a Tapered Stripline Fast Faraday Cup for Measurements on Heavy Ion Beams: Problems and Solutions", Beam Instrumentation Workshop, 1998. (www.slac.stanford.edu/pubs/confproc/biw98/poggi-marcellini.pdf)

C. Deibele, "Proposal for the Design of the Fast Faraday Cup to Measure the Longitudinal Profile of the 2.5 MeV Bearn After the RFQ at the SNS," 2001. (http://it.sns.ornl.gov/asd/public/pdf/sns0004/sns0004.pdf)

M. Ferianis et al, "Characterization of Fast Faraday Cups at the Elettra Linac", Proceedings DIPAC 2003-GSI, Mainz, Germany, July 2003. (http://bel.gsi.de/dipac2003/html/auth0175.html)

What is claimed is:

1. A circuit card stripline Fast Faraday cup system for measuring the structure of a charged particle beam, the system comprising:
   a first groundplane;
   a first dielectric layer bonded to the first groundplane;
   a conductor bonded to the first dielectric layer, a portion of the conductor used as a beam target;
   a second dielectric layer bonded to the conductor by means of a bonding dielectric, the bonding dielectric having the same dielectric constant as the first dielectric layer; and
   an initial groundplane bonded to the second dielectric, the second dielectric and the initial groundplane having a channel for the unimpeded passage of the beam to the beam target, and
   the first groundplane connected to the initial groundplane by electroplated stitching to prevent the occurrence of a resonance condition between the first and initial groundplanes.

2. The system of claim 1 further including a bias conducting ring located at the channel in the initial groundplane, and a means for applying a voltage to the bias conducting ring.

3. The system of claim 1 further including a high bandwidth digitizer connected to the conductor, the high bandwidth digitizer electrodynamically matched to the conductor and the beam target.

4. The system of claim 1 wherein the conductor is connected to the high bandwidth digitizer by means of a single edge launch connector.

5. The system of claim 1 wherein the conductor is connected to the high bandwidth digitizer by means of two edge launch connectors.

6. The system of claim 1 wherein the high bandwidth digitizer is a sampling oscilloscope.

7. The system of claim 1 additionally including a vector network analyzer, the vector network analyzer capable of processing a time-delayed, amplified charged-particle-beam-induced signal from the Fast Faraday cup including the steps of
   measuring the frequency response of the cabling, vacuum interconnects, and amplifier between the Fast Faraday cup and the high bandwidth digitizer;
   Fourier transforming the digitized signal from the high bandwidth digitizer; multiplying the frequency response, Fourier transformed digitized signal, and a window function; and
   inverse Fourier transforming the multiplied frequency response, Fourier transformed digitized signal and window function result to obtain the calibrated time domain charge distribution in the Faraday cup.

* * * * *